*US007919844B2*

United States Patent
Ozguz et al.

(10) Patent No.: US 7,919,844 B2
(45) Date of Patent: *Apr. 5, 2011

(54) TIER STRUCTURE WITH TIER FRAME HAVING A FEEDTHROUGH STRUCTURE

(75) Inventors: Volkan Ozguz, Aliso Viejo, CA (US); Jonathan Stern, Laguna Beach, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 100 days.

This patent is subject to a terminal disclaimer.

(21) Appl. No.: 11/524,090

(22) Filed: Sep. 20, 2006

(65) Prior Publication Data

US 2007/0035033 A1 Feb. 15, 2007

Related U.S. Application Data

(63) Continuation-in-part of application No. 11/441,908, filed on May 26, 2006, now Pat. No. 7,768,113.

(60) Provisional application No. 60/684,372, filed on May 26, 2005.

(51) Int. Cl.
*H01L 23/02* (2006.01)
(52) U.S. Cl. .................................. 257/686; 257/778
(58) Field of Classification Search .................. 257/666, 257/686, 676, 778, 784, E25.023, 621, 774, 257/E21.597; 438/629, 630, 637–640, 668, 438/672, 675
See application file for complete search history.

(56) References Cited

U.S. PATENT DOCUMENTS

| | | | |
|---|---|---|---|
| 5,953,588 A | 9/1999 | Camien et al. | |
| 6,020,220 A * | 2/2000 | Gilleo et al. | 438/119 |
| 6,072,234 A | 6/2000 | Camien et al. | |
| 6,117,234 A | 9/2000 | Yamagishi | |
| 6,184,576 B1 | 2/2001 | Jones et al. | |
| 6,204,455 B1 | 3/2001 | Gilleo et al. | |
| 6,221,769 B1 | 4/2001 | Dhong et al. | |
| 6,294,837 B1 * | 9/2001 | Akram et al. | 257/774 |
| 6,614,104 B2 * | 9/2003 | Farnworth et al. | 257/686 |
| 6,746,894 B2 * | 6/2004 | Fee et al. | 438/106 |
| 6,756,681 B1 * | 6/2004 | Hanawa | 257/774 |
| 6,784,547 B2 | 8/2004 | Pepe et al. | |
| 6,797,537 B2 | 9/2004 | Pepe et al. | |

(Continued)

FOREIGN PATENT DOCUMENTS

DE    102 50 621    5/2004

(Continued)

OTHER PUBLICATIONS

Communication from European Patent Office for EP 06 25 5467.0 dated Nov. 4, 2008.

(Continued)

*Primary Examiner* — Wai-Sing Louie
*Assistant Examiner* — Bilkis Jahan

(57) ABSTRACT

A stackable tier structure comprising one or more integrated circuit die and one or more feedthrough structures is disclosed. The I/O pads of the integrated circuit die are electrically rerouted using conductive traces from the first side of the tier structure to a feedthrough structure comprising one ore more conductive structures. The conductive structures electrically route the integrated die pads to predetermined locations on the second side of the tier structure. The predetermined locations, such as exposed conductive pads or conductive posts, in turn, may be interconnected to a second tier structure or other circuitry to permit the fabrication of a three-dimensional microelectronic module comprising one or more stacked tiers.

30 Claims, 10 Drawing Sheets

U.S. PATENT DOCUMENTS

| | | | |
|---|---|---|---|
| 6,946,325 B2 * | 9/2005 | Yean et al. | 438/112 |
| 6,982,487 B2 * | 1/2006 | Kim et al. | 257/774 |
| 7,015,128 B1 | 3/2006 | Chiang et al. | |
| 7,091,592 B2 * | 8/2006 | Chen et al. | 257/686 |
| 2003/0062631 A1 | 4/2003 | Nemoto | |
| 2003/0112610 A1 | 6/2003 | Frankowsky et al. | |
| 2005/0077632 A1 | 4/2005 | Hedler et al. | |
| 2005/0094490 A1 * | 5/2005 | Thomenius et al. | 367/155 |
| 2006/0079020 A1 | 4/2006 | Omizo et al. | |
| 2006/0091561 A1 | 5/2006 | Dangelmaier et al. | |
| 2006/0267213 A1 * | 11/2006 | Ozguz et al. | 257/777 |

FOREIGN PATENT DOCUMENTS

| | | |
|---|---|---|
| DE | 103 48 620 | 6/2005 |
| DE | 1020040 27 788 | 1/2006 |
| EP | 0 611 129 | 8/1994 |
| WO | WO 2006/032250 | 3/2006 |

OTHER PUBLICATIONS

European Search Report for EP 06 25 5467.0 completed Dec. 7, 2007.

Partial European Search Report for EP 06 25 5467.0 completed Dec. 7, 2007.

US Office Action issued in U.S. Appl. No. 11/441,908 mailed Apr. 9, 2009.

Final Office Action for U.S. Appl. No. 11/441,908 mailed Sep. 4, 2009.

Notice of Allowance issued in U.S. Appl. No. 11/441,908 and mailed Jan. 15, 2010.

* cited by examiner

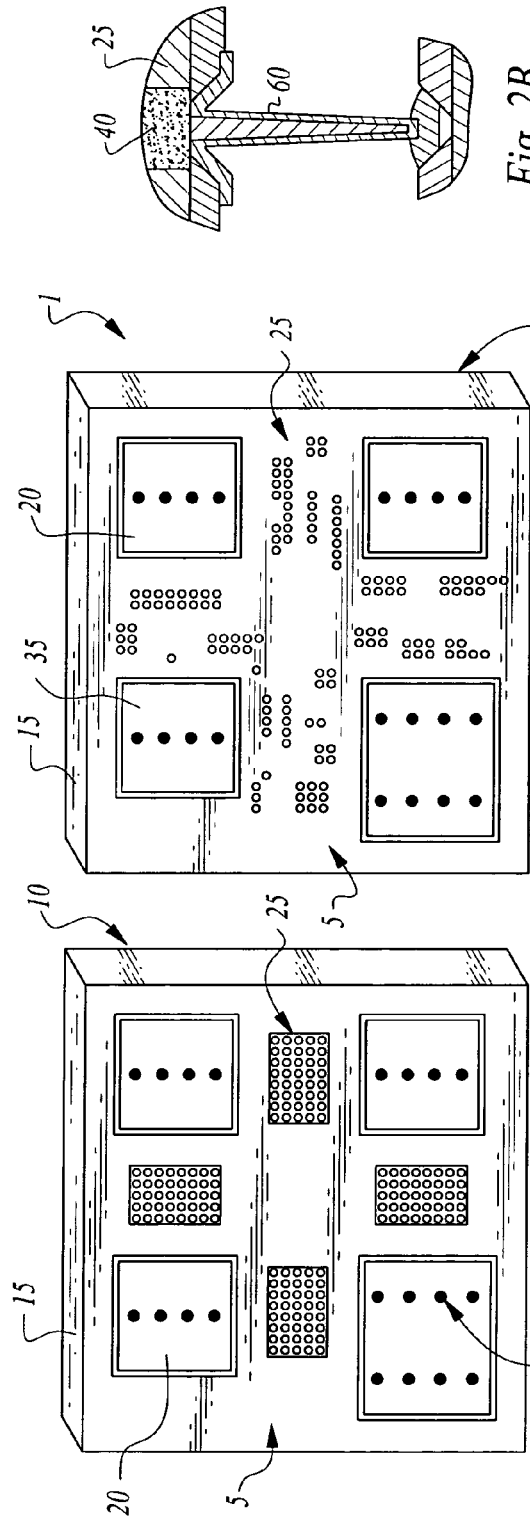
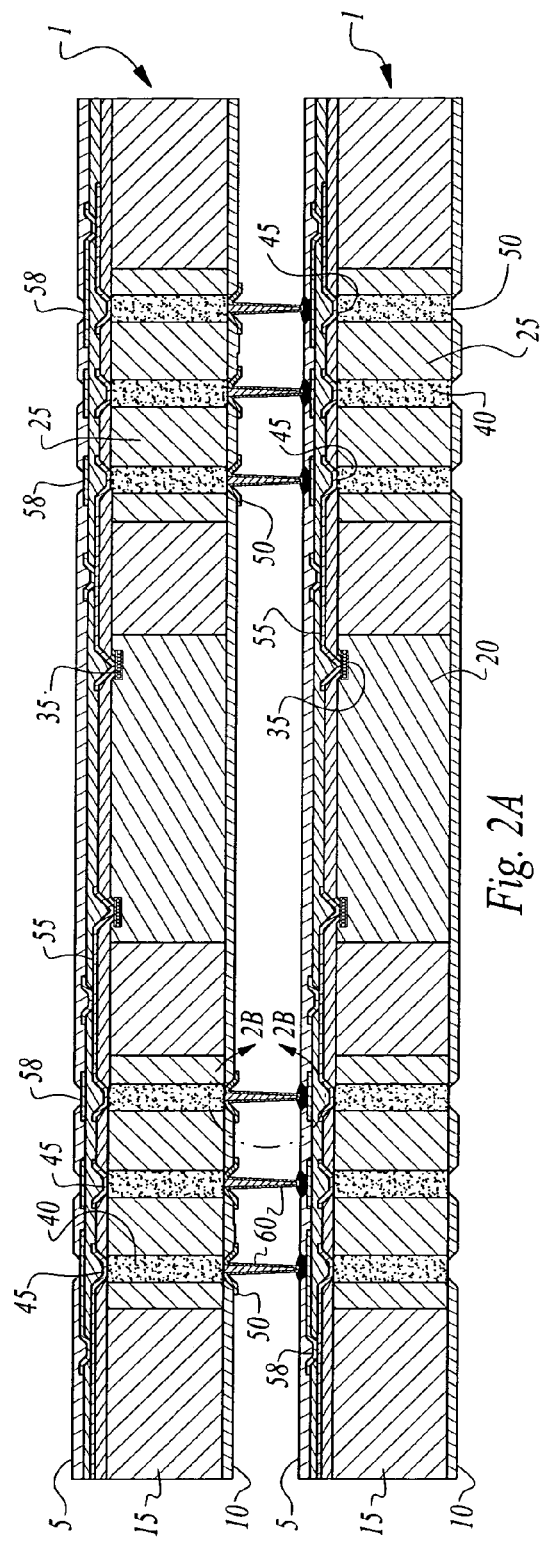

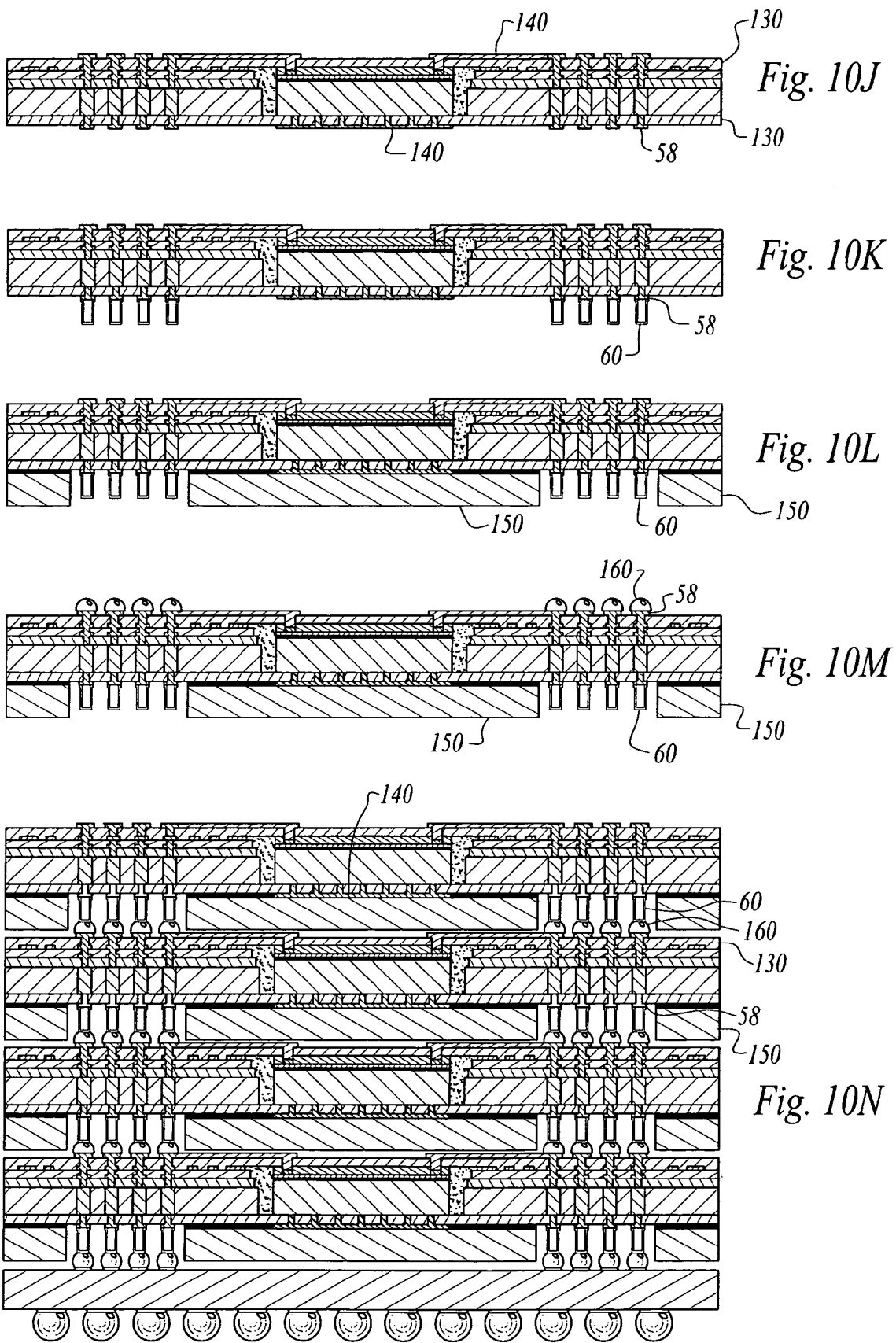

TIER STRUCTURE WITH TIER FRAME HAVING A FEEDTHROUGH STRUCTURE

CROSS REFERENCE TO RELATED APPLICATIONS

This application is a continuation in part of U.S. patent application Ser. No. 11/441,908, filed May 26, 2006 now U.S. Pat. No. 7,768,113 entitled "Stackable Tier Structure Comprising Prefabricated High Density Feedthrough", which in turn claims priority to Provisional Patent Application Ser. No. 60/684,372, entitled "Stackable Layers Comprised of Encapsulated Integrated Circuit Chips Interconnected With Prefabricated Via Structures", and filed May 26, 2005, each application of which is fully incorporated herein by reference.

STATEMENT REGARDING FEDERALLY SPONSORED RESEARCH AND DEVELOPMENT

Not applicable.

BACKGROUND OF THE INVENTION

1. Field of the Invention

The invention relates generally to stackable tier structures comprising microelectronic circuitry. More particularly, the invention relates to stackable tier structures comprising one or more integrated circuit die and one or more area interconnect or "feedthrough structures" embedded in a molded or prefabricated tier frame, which tier structures may be stacked and electrically interconnected to create compact, three-dimensional microelectronic modules.

2. Description of the Related Art

The ability to form very thin, stackable layers, each containing one or a plurality of homogeneous or heterogeneous integrated circuit die, is desirable and allows high density, high speed electronic systems to be assembled for use in military, space, security and other applications.

Examples of such layers and modules, referred to as "neo-layers" or "neo-stacks" are disclosed in U.S. Pat. No. 6,797,537, Method of Making Stackable Layers Containing Encapsulated Integrated Circuit Chips With One or More Overlying Interconnect Layers, U.S. Pat. No. 6,784,547, Stackable Layers Containing Encapsulated Integrated Circuit Chips With One or More Overlying Interconnect Layers, U.S. Pat. No. 6,117,704, Stackable Layer Containing Encapsulated Chips, U.S. Pat. No. 6,072,234, Stack of Equal Layer Neo-Chips Containing Encapsulated IC Chips of Different Sizes, and U.S. Pat. No. 5,953,588, Stackable Layers Containing Encapsulated IC Chips, all of which are incorporated fully herein by reference and all of which are assigned to Irvine Sensors Corp., the assignee herein.

The stacking and interconnection of very thin microelectronic layers allows high circuit speeds in part because of short lead lengths and related reduced parasitic impedance and electron time-of-flight. These desirable features combined with a very high number of circuit and layer interconnections allow relatively large I/O designs to be implemented in a small volume.

What is needed is a structure that combines the above attributes but that can be fabricated using well-defined processes at relatively low cost.

BRIEF SUMMARY OF THE INVENTION

A stackable tier structure comprising one or more homogeneous or heterogeneous integrated circuit die (ICs) and one or more area interconnect structures, also referred to as "feedthrough structures", is disclosed. The I/O, power and ground pads of the integrated circuit die in the tiers are electrically rerouted to predetermined locations using metallized conductive traces from the first side of the tier structure to one or more feedthrough structures. The feedthrough structures comprise one ore more conductive structures contained within and through its thickness.

The conductive structures, which may comprise conductive vias, encapsulated, stacked metal stud bumps or encapsulated, metallized polymer columns, electrically route the integrated circuit die pads through the thickness of the tier structure to predetermined locations on the second side of the tier structure. The predetermined locations comprise exposed conductive pads or outwardly projecting metallized polymer columns which may, in turn, may be electrically connected to a second tier structure or to external circuitry.

The stacking and interconnecting of multiple tier structures allows the fabrication of three-dimensional microelectronic modules comprising stacked tiers that provide high circuit density within a relatively small form factor.

BRIEF DESCRIPTION OF THE DRAWINGS

FIG. 1A illustrates a molded tier structure, showing the tier frame, integrated circuit die and feedthrough structures of the invention.

FIG. 1B illustrates a "die-in-silicon" tier structure, showing the tier frame, integrated circuit die and feedthrough structures of the invention.

FIG. 2A shows a stacked, two-tier module with the respective tier structures interconnected by means of metallized polymer columns.

FIG. 2B shows a detail of FIG. 2A and the metallized polymer column thereof.

DETAILED DESCRIPTION OF THE INVENTION

Figure 3A:
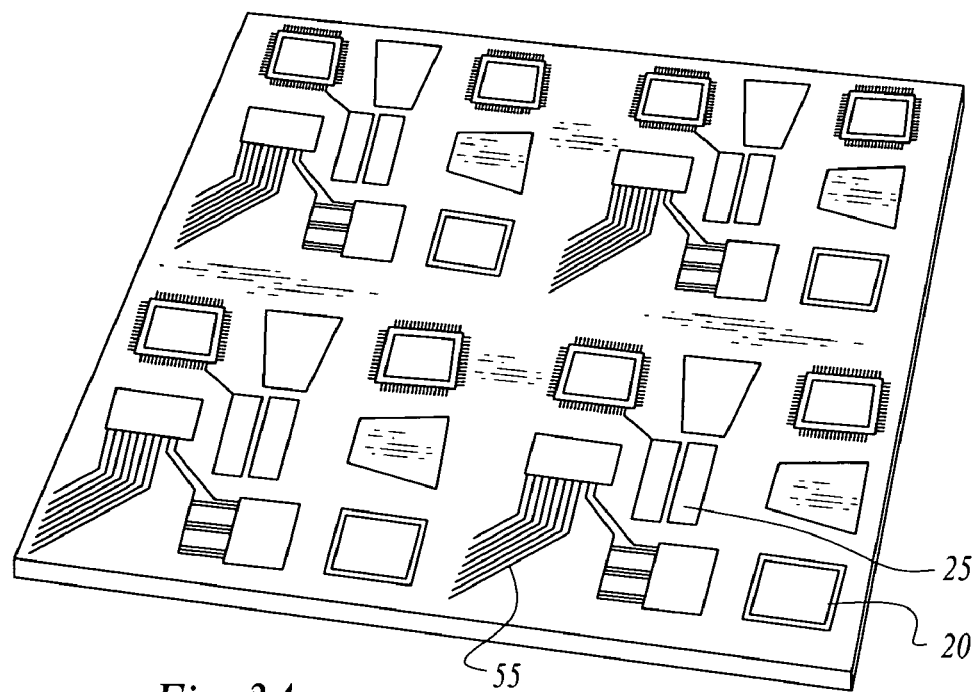
FIG. 3A a 2×2 array of unsingulated, molded tier structures.
Figure 3B:
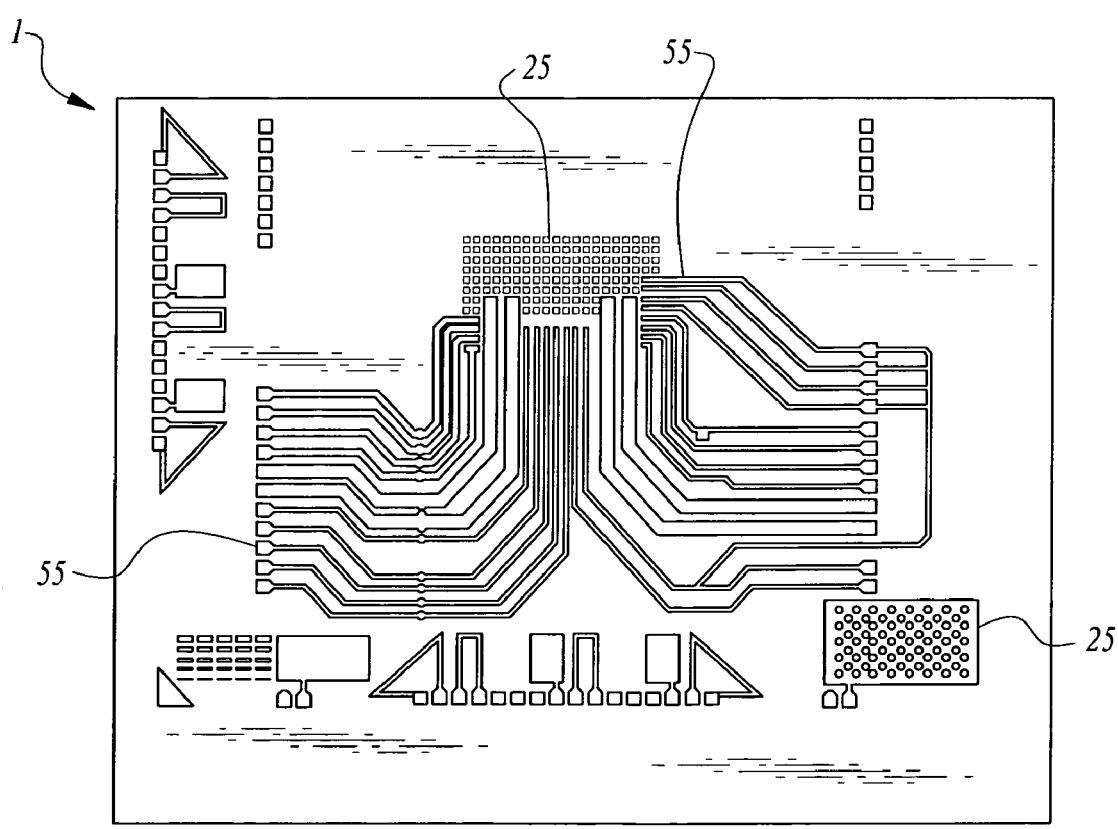
FIG. 3B is a top view of a singulated molded tier structure, showing conductive traces for the rerouting of signals from the I/O pads of an integrated circuit die to a feedthrough structure.

Turning now to the figures wherein like numerals designate like elements among the several views, FIGS. 1A and 1B show preferred alternative embodiments of the stackable tier structure 1 of the present invention with the tier frame thickness exaggerated. As will be described more fully below, tier 1 generally comprises first tier side 5 and opposing second tier side 10. Tier 1 is further comprised of a tier frame 15, one or more integrated circuit die 20 and one or more feedthrough structures 25.

Integrated circuit die 20 comprises active circuitry and one or more I/O pads 35 for the routing of electrical signals to and from the active circuitry on the die.

I/O pads 35 are disposed in tier frame 15 so as to be substantially coplanar with first tier side 5 by embedding integrated circuit die 20 within the thickness of tier frame 15 as further discussed below.

FIG. 2A reflects a cross-section of a stack of two interconnected tiers. Feedthrough structure 25 is comprised of one or more electrically conductive structures 40 which have a first terminal end 45 terminating on first tier side 5 and a second terminal end 50 terminating on second tier side 10. In this manner, an electrically conductive "area interconnect" is available for the routing of electrical signals through the thickness of the tier frame material to and from the respective major surfaces of tier 1 and the devices thereon.

A conductive trace 55 is provided on first tier side 5 to electrically connect I/O pad 35 to first terminal end 45 on first tier side 5 which is electrically connected to second terminal end 50. Second terminal end 50 is disposed and accessible on second tier side 10.

In the alternative preferred embodiment of tier structure 1 illustrated in FIG. 1A, FIG. 2A and FIGS. 3A and 3B, one or more prefabricated feedthrough structures 25 and one or more prefabricated integrated circuit die 20, each having one or more I/O pads 35, are molded in a dielectric material at predetermined locations in tier frame 15 using a suitable potting material such as Epoxy Set 3030 to define a tier 1 having an initial thickness. All manner of integrated circuit die 20 may be included in the molded tier frame embodiment, including, without limitation, packaged, unpackaged or depackaged die, FPGA die, microprocessor die, memory die or the like.

Homogeneous or heterogeneous die may be incorporated into the tier frame 15, depending upon the end needs of the user. Separately fabricated feedthrough structures 25 may be fabricated in a separate operation or purchased from a separate source for subsequent assembly into tier 1 of the invention in one of its embodiments.

The active circuitry of integrated circuit die 20 and the prefabricated feedthrough structure 25 surface are preferably encapsulated within the tier volume so that all element surfaces are substantially coplanar with first tier side 5. This may be accomplished for example by providing an integrated circuit die 20 and prefabricated feedthrough structure 25 of substantially equal thickness and affixing the active circuitry on the integrated circuit die and a surface of the feedthrough structure in a mold using a temporary adhesive. The elements are then potted in an encapsulant to approximately the thickness of the die and feedthrough structure.

Next, a predetermined portion of second tier side 10, inactive integrated circuit die surface and the opposing surface of the feedthrough structure 25 is backthinned, i.e., removed along with excess thickness of potting material by grinding, lapping, CMP or equivalent means whereby the desired tier planarization and thickness is achieved.

The temporary adhesive that bonds the active surface of the integrated circuit die 15 and feedthrough structure 25 in the mold is released, providing a tier 1 with accessible I/O pads 35 and a feedthrough structure 25 with accessible first and second terminal ends 45 and 50 respectively.

It has been determined that using known semiconductor packaging and thinning processes, that tier thicknesses in the range of 100-200 microns or thinner are achievable.

After desired tier thinning, a dielectric or passivation layer 57, such as a polyimide, is provided on the first and second major tier surfaces. I/O pads 35 and the conductive first terminal ends 45 are exposed through the dielectric layer 57 to define interconnection points, referred to as contact pads 58 herein, using known photolithographic processes. The selected ones of exposed I/O pads 35 and exposed first terminal ends 45 are interconnected and/or rerouted to predetermined locations using metallized conductive traces 55. Metallized conductive traces 55 are fabricated as is known in the photolithographic arts to interconnect appropriate conductive structures, contact pads and I/O pads.

A contact pad 58 for interconnection may also be conveniently defined at any desired location on each major tier surface by exposing a section of a conductive trace. As reflected in FIG. 2A, multiple reroute metallization layers can be readily fabricated by repeating the polyimide, via formation and metallization reroute steps to form a multi-layer conductive trace structure. The use of multiple layers of reroute metallization on a surface of tier 1 allows the fabrication of complex circuitry on the surface of the tier which is necessary for high I/O count devices such as field programmable gate arrays (FPGAs).

In a preferred embodiment, second tier side 10 comprises exposed second terminal ends 50 of feedthrough structure 25, some or all of which may be in electrical connection with I/O pads 35. Using processes as discussed above, exposed second terminal ends 50 on second tier side 10 are electrically connected to adjacent stacked tier layers using, for example, outwardly projecting, conductive metallized polymer columns 60 formed upon contact pads 58, exposed terminal ends 45 or 50 or exposed portions of conductive traces 55.

Figure 4A:
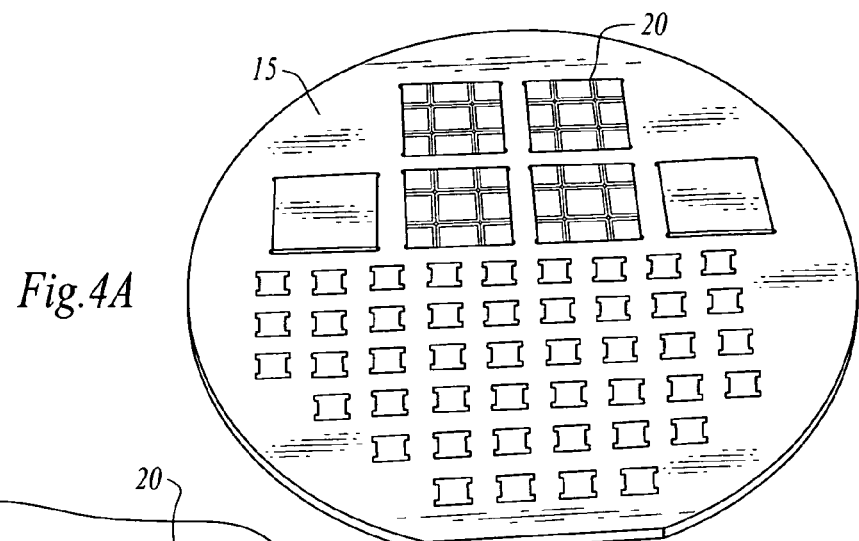
FIG. 4A reflects an array of "die-in-silicon" tier structures wherein prefabricated integrated circuit die have been embedded in a plurality of die apertures in silicon tier frame by means of an epoxy.
Figure 4B:
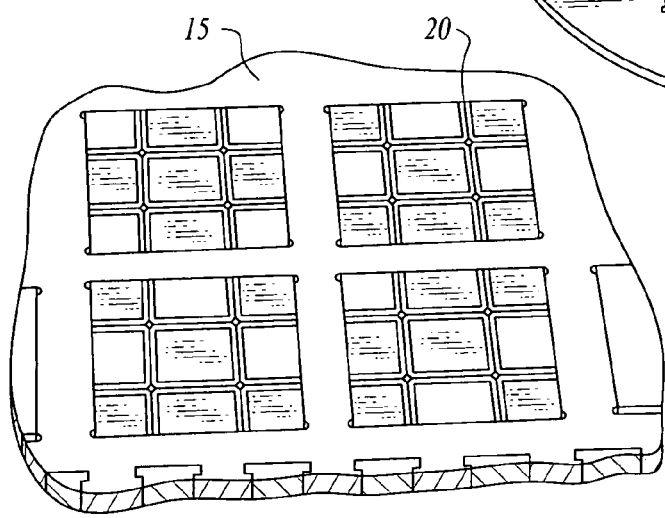
FIG. 4B reflects an enlarged view of the array of "die-in-silicon" tier structures of FIG. 4A wherein prefabricated integrated circuit die have been embedded in plurality of die apertures in a silicon tier frame by means of an epoxy.

In an alternative preferred embodiment of the tier frame 15 of the invention reflected in FIG. 1B and FIGS. 4A and 4B, very thin tier frame structures may be desirably prefabricated from high resistivity silicon wafers, for instance, silicon wafers with a resistivity in excess of about 100 ohms/cm. The use of high resistivity silicon as a tier frame material to fabricate "die-in-silicon" tier structures provides a well-matched coefficient of thermal expansion (CTE) with respect to embedded active silicon integrated circuit die and/or silicon feedthrough structures.

Alternatively, separately fabricated silicon feedthrough structures 25 can be defined directly within and through the silicon tier frame material, creating an integral tier frame and feedthrough assembly with the beneficial result of a unitary tier frame/feedthrough assembly and a well-matched coefficient of thermal expansion.

In the "die-in-silicon" embodiment, apertures for the receiving of integrated circuit die and/or, if desired, prefabricated feedthrough structures, are defined in a silicon wafer or blank, preferably by use of photolithographic processes using a dry reactive ion etch process (DRIE) or using water-jet cut silicon blanks. The DRIE process is preferred because of its ability to create well-defined vertical sidewalls and for its ability to bulk etch silicon material. The use of DRIE provides precision matched apertures for receiving integrated circuit die and prefabricated feedthrough structures with a minimum gap between the die and aperture sidewall though any silicon removal means may be utilized to define the appropriate apertures with acceptable tolerance and edge roughness. As in the molded tier frame embodiment above, all manner of integrated circuit die may be incorporated into the "die-in-silicon" embodiment.

In the "die-in-silicon" embodiment, integrated circuit die and/or prefabricated feedthrough structures are placed in their respective apertures and the aperture sidewall gaps filled with appropriate filler or potting material. Epoxy Set 3030 has been found to have suitable characteristics for gap-filling in the die-in-silicon" embodiment.

Figure 5:
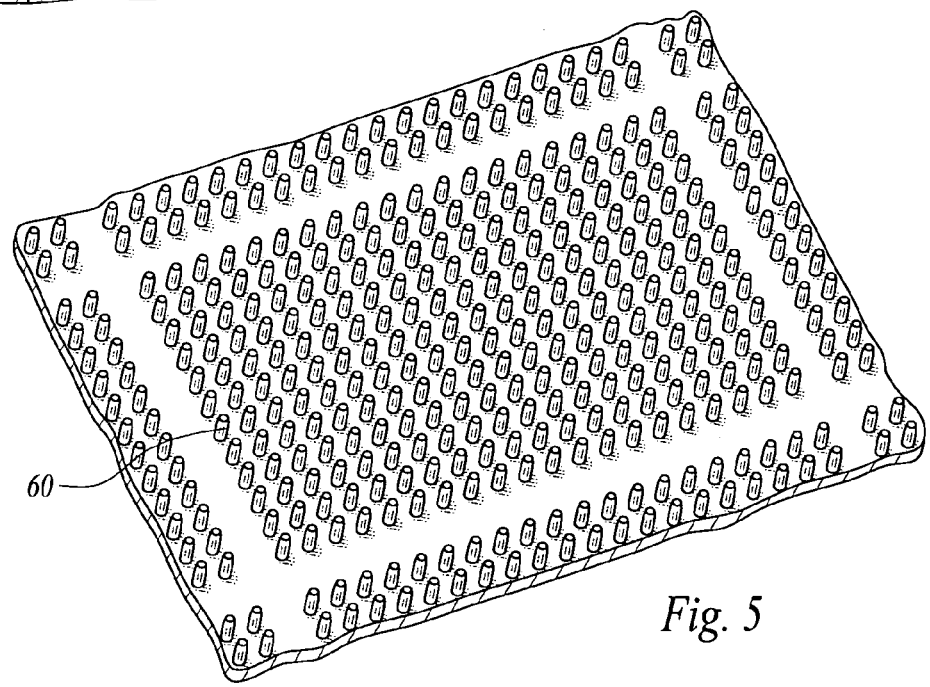
FIG. 5 illustrates an array of metallized photoresist polymer columns formed on a base substrate.
Figure 6:
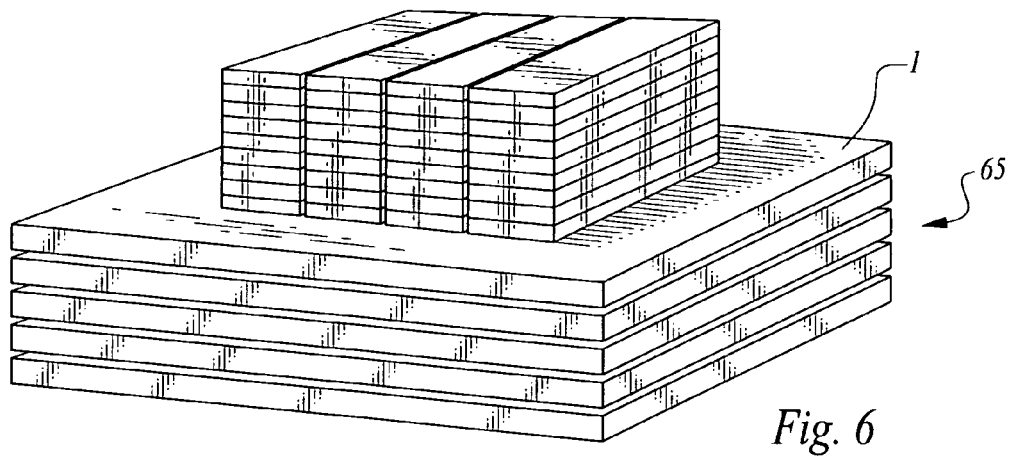
FIG. 6 shows an exemplar three-dimensional stack of interconnected tier structures.

Turning to FIG. 5, an exemplar array of metallized polymer columns 60 is shown. As illustrated in FIG. 5, the individual columns are less than about 200 microns in height, less than about 75 microns in diameter and have a pitch of less than about 75 microns.

The process used to fabricate high aspect ratio, metallized polymer columns for tier-to-tier interconnection can also be conveniently used to make prefabricated feedthrough structures 25 for use in the instant invention.

In a first preferred method of making the feedthrough structures of the invention comprises forming conductive metallized polymer columns formed with a solderable photoresist. In this preferred embodiment, a high contrast epoxy-based photoresist is used to fabricate a polymer post array and base of a predetermined height, diameter and pitch. One or more polymer posts or columns are formed using as high optical transparency photoresist such as SU-8 photoresist available from MicroChem Corp. The SU-8 photoresists are capable of forming high aspect ratio features and very straight sidewall structures such as are found in MEMS applications.

After photoresist post formation, a field metal such as gold is plated upon the surface of the photoresist post structures and base whereby the entire column array is electrically conductive. The post structure array and base are encapsulated in a suitable dielectric encapsulant and the base and upper portion of the metallized columns are removed (i.e., thinned on the upper and lower surface of the encapsulated array) whereby the individual metallized columns are electrically singulated and retained within the encapsulated structure to form an array of conductive, pipe-like via structures within the encapsulated feedthrough structure.

In a second alternative preferred method of making the feedthrough structure of the invention, multiple stacked stud bumps are formed on a sacrificial substrate by the use of conventional wire bonding equipment. Columns of the wire balls, or stud bumps, are fabricated on a sacrificial substrate at a predetermined pitch and height, and then encapsulated in a suitable dielectric material. The sacrificial substrate removed by back-thinning to expose the lower-most stud bump. The surface of the feedthrough structure assembly is ground to expose the top-most stud bump in each of the columns.

The resultant structure comprises an array of encapsulated conductive columns with electrically accessible first terminal ends and second terminal ends suitable for use as feedthrough structures in the instant invention.

In yet a third alternative preferred method for making the feedthrough structure of the invention, through-vias are defined in high resistivity silicon wafers (e.g., greater than 100 ohms/cm) at predetermined locations such as by a dry reactive ion etch process. The through-vias are plated or filled with a conductive material such as copper to create a feedthrough structure comprising generally opposing first feedthrough structure major surface and second feedthrough structure-major surface, each with one or more exposed conductive vias (that is, first and second terminal ends) for electrical connection between the first feedthrough structure major surface and second feedthrough structure major surface.

The third preferred embodiment of making the feedthrough structure of the invention comprises providing one or more 65 um diameter vias with a 250 um pitch in a high-resistivity silicon wafer such as are available from Tru-Si Technologies, Inc. The vias are filled with copper such that when the feedthrough structure is backthinned, the copper material in the vias is exposed, creating a very thin feedthrough structure. One or more feedthrough structures comprising arrays of conductive vias can be fabricated in a single silicon wafer and then singulated to a predetermined length and width using, for instance, a conventional wafer dicing saw.

In yet a fourth alternative preferred method of making the feedthrough structure of the invention, as in the case of the "die-in-silicon" embodiment, the feedthrough structures are desirably formed directly in and integral with the tier frame silicon material itself using a "via-in-silicon" method such as by dry reactive ion etching.

As indicated above and illustrated among the several views, the disclosed embodiments of the tier structures may desirably be stacked and electrically interconnected to form a high density electronic module 65 as is reflected, for instance, in FIG. 2A, FIG. 6, FIG. 11 and FIG. 12, using suitable means for electrically connecting the adjacent stacked tiers.

As will be more fully discussed below, a preferred embodiment of the stacked module 65 of the invention generally comprises exposing selected first or second terminal ends or predetermined portions of the conductive traces on selected surfaces of the tier structures to be interconnected to create contact pads 58 at predetermined locations on the respective sides of the tiers 1. Selected ones of contact pads 58 on the respective sides of the tiers are defined so as to be aligned and in registration with one another. Outwardly projecting, metallized polymer columns 60 are then formed upon predetermined contact pad surfaces on at least one of the opposing tiers, so as to be in electrical connection therewith. The formed metallized polymer columns are in registration with the opposing respective contact pads on opposing tier surfaces and are received by same.

As seen in FIGS. 7A through 7D, a preferred process for forming outwardly projecting, metallized polymer columns 60 upon exposed contact pads 58 or selected interconnect points, comprises applying a SU-8 layer over the selected tier side wherein a columnar SU-8 post 68 is defined approximately central upon the respective contact pads 58 with a cross-sectional area less than the area of the contact pads 58 using well-known photolithographic processes. The SU-8 posts are defined so as to be in registry with the respective pads 58 of the corresponding tier on which they will be electrically connected. The cross-section of the posts is less than the exposed area of the contact pad to ensure subsequent electrical connection of the two when conductive plating occurs.

After post formation, a field metal 69 such as gold is applied as by sputtering over the tier surface so as to plate SU-8 post 68 surface area and the contact pads 58 or interconnect points. This step effectively puts the metallization of plated SU-8 columnar post 68 in electrical connection with the contact pad 58 on which it is disposed.

Figure 7A:
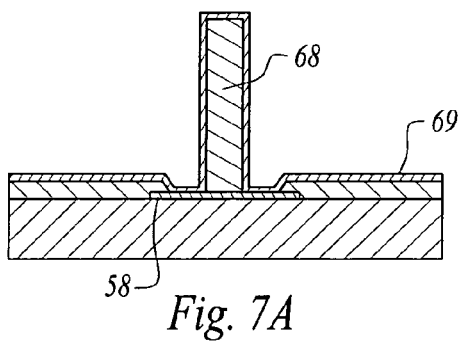
FIGS. 7A, 7B, 7C and 7D disclose process steps in a preferred method of forming a metallized polymer column.
Figure 7B:
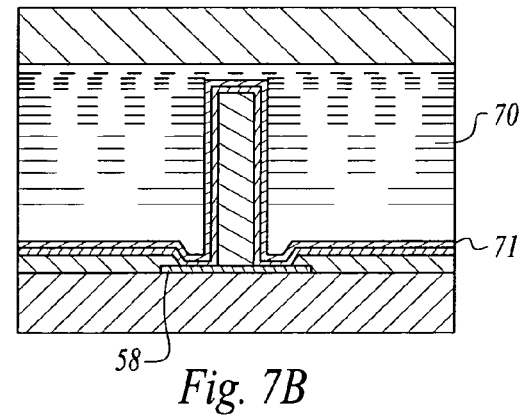
Figure 7C:
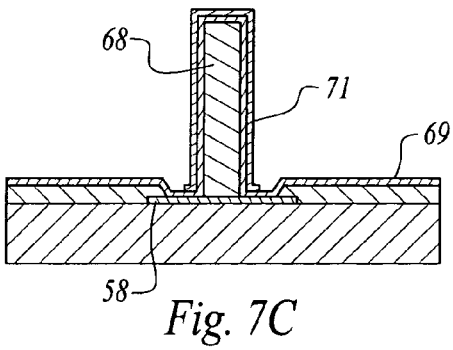

A second photolithographic step in FIG. 7B uses a high refractive index fluid 70 in immersion lithography and is performed to apply a photoresist mask layer 71 substantially limited to the SU-8 post surface area and base perimeter as seen in FIG. 7C.

Figure 7D:
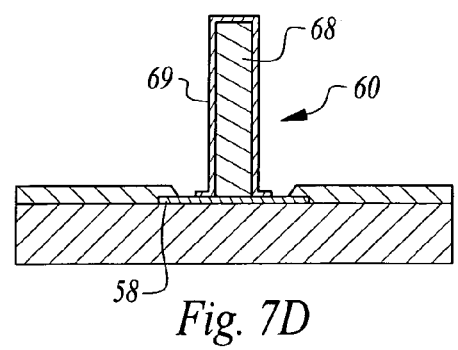

As seen in FIG. 7D, the field metal layer 69 is etched from exposed surfaces and the remaining photoresist striped from the SU-8 post, leaving one or more high aspect ratio, electrically conductive metallized polymer columns 60 in electrical connection with the underlying contact pad 58.

Figure 8A:
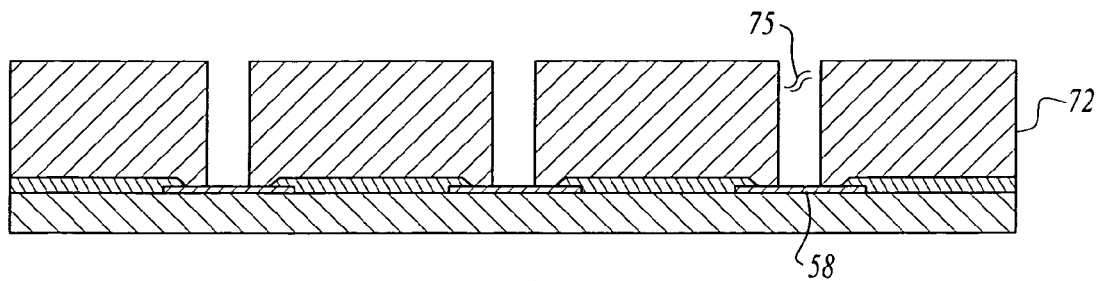
FIGS. 8A, 8B and 8C show steps in an alternative preferred method of forming a metallized polymer column.
Figure 8B:
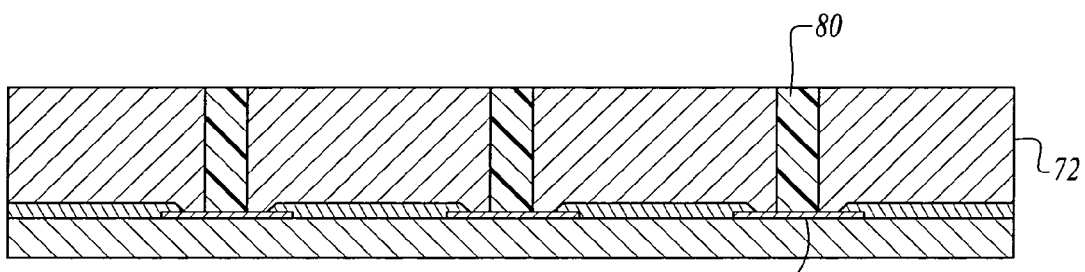
Figure 8C:
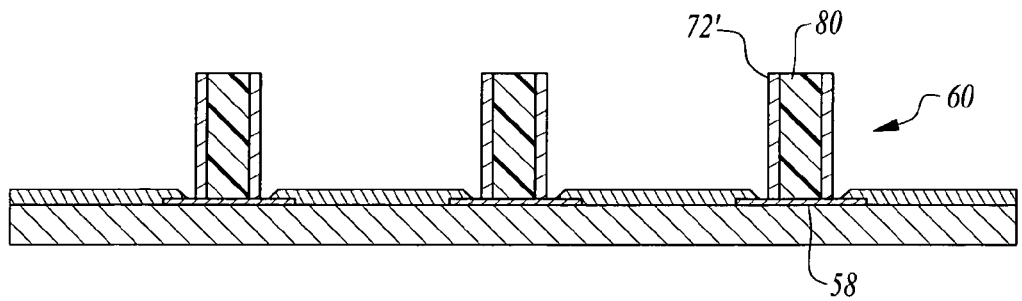

An alternative method of metallized polymer column fabrication is illustrated in FIGS. 8A, 8B and 8C. In this method, an SU-8 layer 72 is provided upon the surface of tier 1, including over contact pads 58. High aspect ratio vias 75 are defined in the SU-8 layer as seen in FIG. 8A. Next, the defined vias are filled with a solderable polymer 80 as shown in FIG. 8B. Finally, predetermined portions of the SU-8 layer are selectively removed such as by reactive ion etching (RIE) so as to provide a thin layer of SU-8 cladding 72' about the outer periphery of the remaining solderable polymer columns 60 as shown in FIG. 8C. The upper portion of solderable polymer 80 remains exposed for subsequent electrical connection and the lower portion of solderable polymer 80 is in electrical contact with contact pad 58.

As illustrated in FIGS. 7D and 8C, metallized polymer columns are about 200 microns in height.

After metallized polymer column fabrication as by the processes discussed above, a solder material is disposed upon predetermined contact pads or interconnect points of the selected tier structure(s) to be stacked which may, for instance comprise the terminal end of a conductive structure (e.g., conductive via), contact pad, interconnect point or an I/O pad. The metallized polymer columns are oriented such that, upon solder reflow, an electrical connection is formed between the metallized polymer columns, the solder material and the respective contact pads, metallized polymer columns, interconnect points or I/O pads.

Alternative methods of electrically interconnecting the respective tiers include, without limitation, the use of stacked stud bumps in connection with respective conductive structure, contact pad, interconnect point or an I/O pad or the use of soldering, and solder pastes, conductive epoxies, anisotropic conductive films or anisotropic conductive adhesives or other equivalent electrical connection means.

It is noted that the use of metallized polymer columns to interconnect tier structures provides a beneficial "stand-off" air gap between tiers such that an air flow or coolant flow may desirably be directed between tier layers as a thermal management tool to remove excess heat while the active circuitry on the integrated circuit die is operating. To provide alternative or supplemental heat management to the tiers in the module, a thermal management element, such as a copper shim may be disposed at predetermined locations between tier layers.

Figure 9:
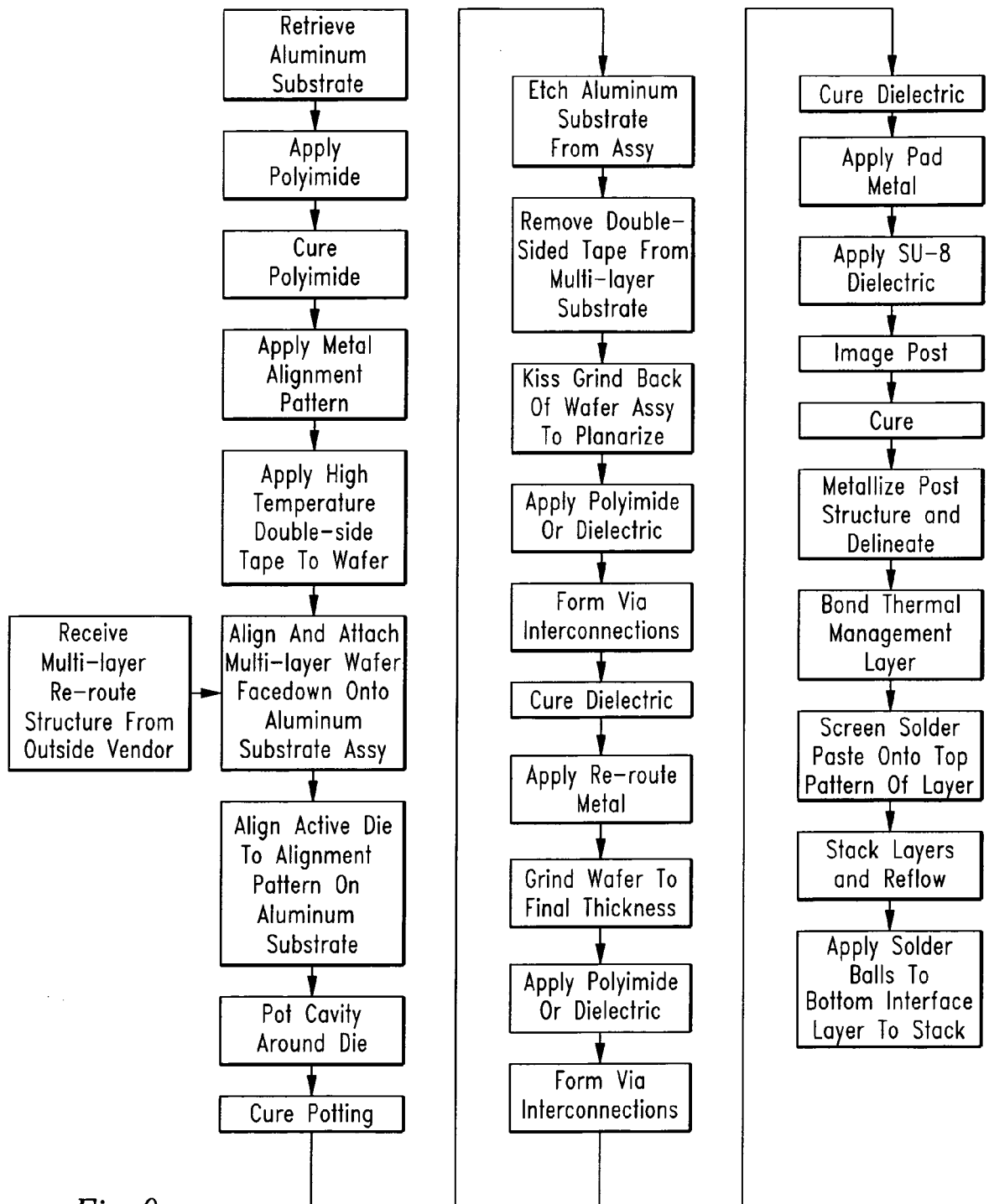
FIG. 9 shows a preferred tier structure fabrication and stack assembly flow diagram.

A preferred system process flow for the fabrication and assembly of the tier structure and module of the invention is reflected in FIG. 9.

Figure 10A:
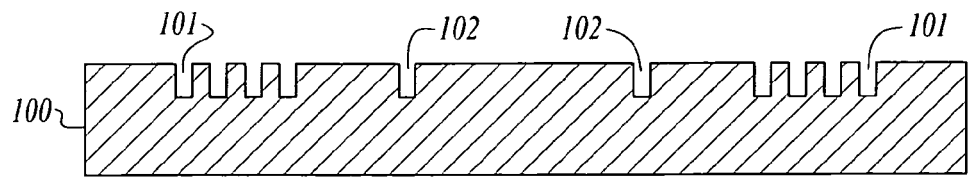
FIGS. 10A through 10N illustrate steps in a preferred method of fabricating a "die-in-silicon" tier structure and stacked module with concurrent feedthrough structure and metallized polymer column formation.

A preferred series of process steps for fabricating the "die-in-silicon" tier structure and module embodiment with concurrent feedthrough structure and metallized polymer column fabrication is illustrated in FIGS. 10A through 10N, showing a ball grid array interconnect format in the resultant module.

FIG. 10A shows a silicon wafer 100 having a top surface and a lower surface with predetermined portions etched away for the definition of feedthroughs 101 and trenches 102, the trenches having a predetermined length and depth to define a predetermined sacrificial surface area for the subsequent creation of one or more die cavities in the wafer.

Figure 10B:
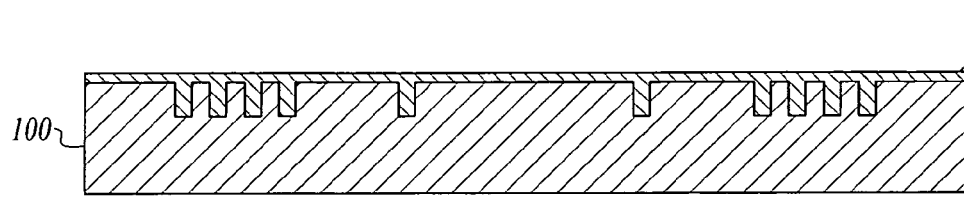

FIG. 10B shows the feedthroughs 101 and trenches 102 plated with a metallization layer 110 such as a copper material.

Figure 10C:
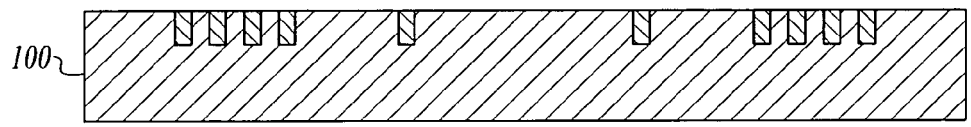

FIG. 10C shows silicon wafer 100 after top surface planarization of the metallization layer resulting in the various feedthroughs and trenches filled with a conductive metal but with the surface of silicon wafer 100 exposed in selected locations.

Figure 10D:
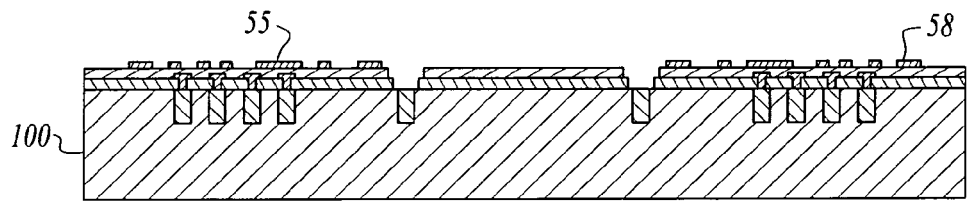

FIG. 10D shows silicon wafer 100 after multi-layer rerouting has been defined on the surface of silicon wafer 100 to create conductive traces 55 and contact pads 58.

Figure 10E:
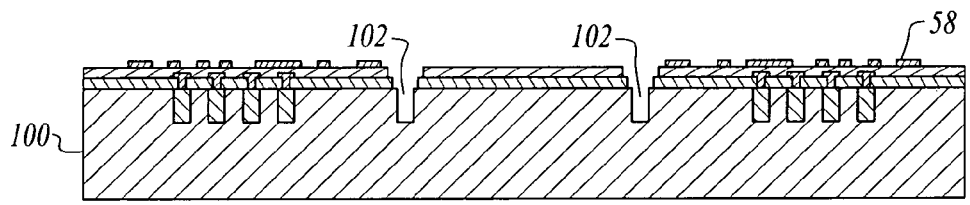

FIG. 10E shows the metallization within trenches 102 having been removed by a suitable etching process to expose the silicon wafer 100 material within trenches 102.

Figure 10F:
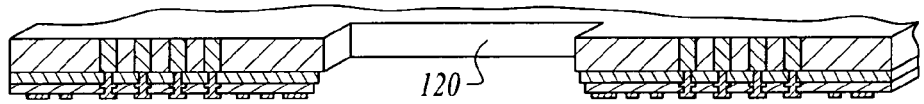

FIG. 10F shows wafer 100 having been backthinned as by lapping, grinding, CMP or other suitable process to a predetermined depth to expose the metallization within feedthroughs 101 and to the depth of trenches so as to singulate the silicon wafer material within the trench perimeter to define a die cavity 120.

Figure 10G:
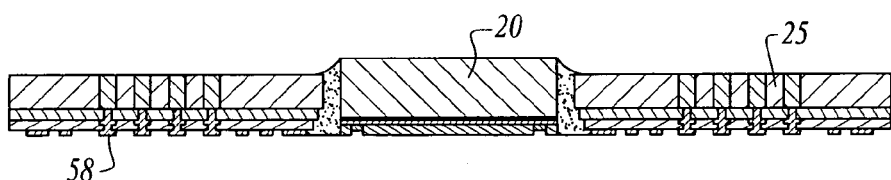

FIG. 10G shows the insertion and potting of an integrated circuit die 20 into die cavity 120 wherein the die has been affixed by the use of a suitable epoxy.

Figure 10H:
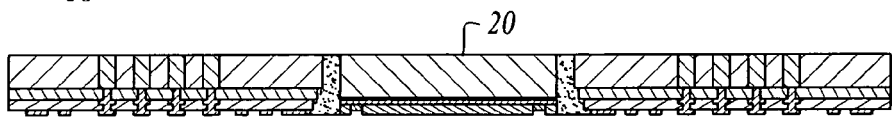

FIG. 10H shows silicon wafer 100 after a second planarizing step whereby the inactive surface of the integrated circuit die 20 is planerized substantially coplanar with the lower surface of silicon wafer 100.

Figure 10I:
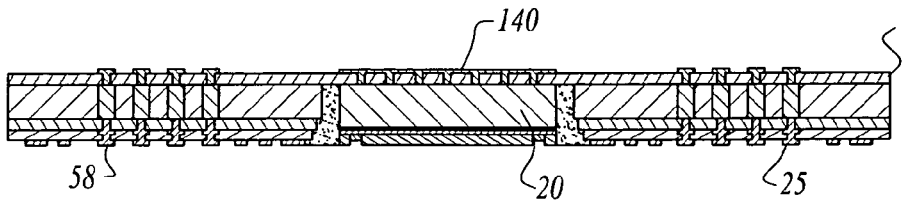

FIG. 10I shows silicon wafer 100 with a dielectric layer 130 and metal layer 140 defined thereon.

FIG. 10J shows silicon wafer 100 having been inverted with added dielectric layers 130 and sputtered metal 140 to connect die pads to contact pads.

FIG. 10K shows silicon wafer 100 with metallized polymer columns 60 defined on selected contact pads 58.

FIG. 10L shows silicon wafer 100 with a thermal management layer 150 such as a copper shim bonded to silicon wafer 100.

FIG. 10M shows silicon wafer 100 with solder bumps 160 defined on selected contact pads 58 on the bottom surface of the wafer.

FIG. 10N shows a plurality of the layers of the process stacked and electrically interconnected by means of reflowed solder bumps 160 to define a stacked module.

Figure 11:
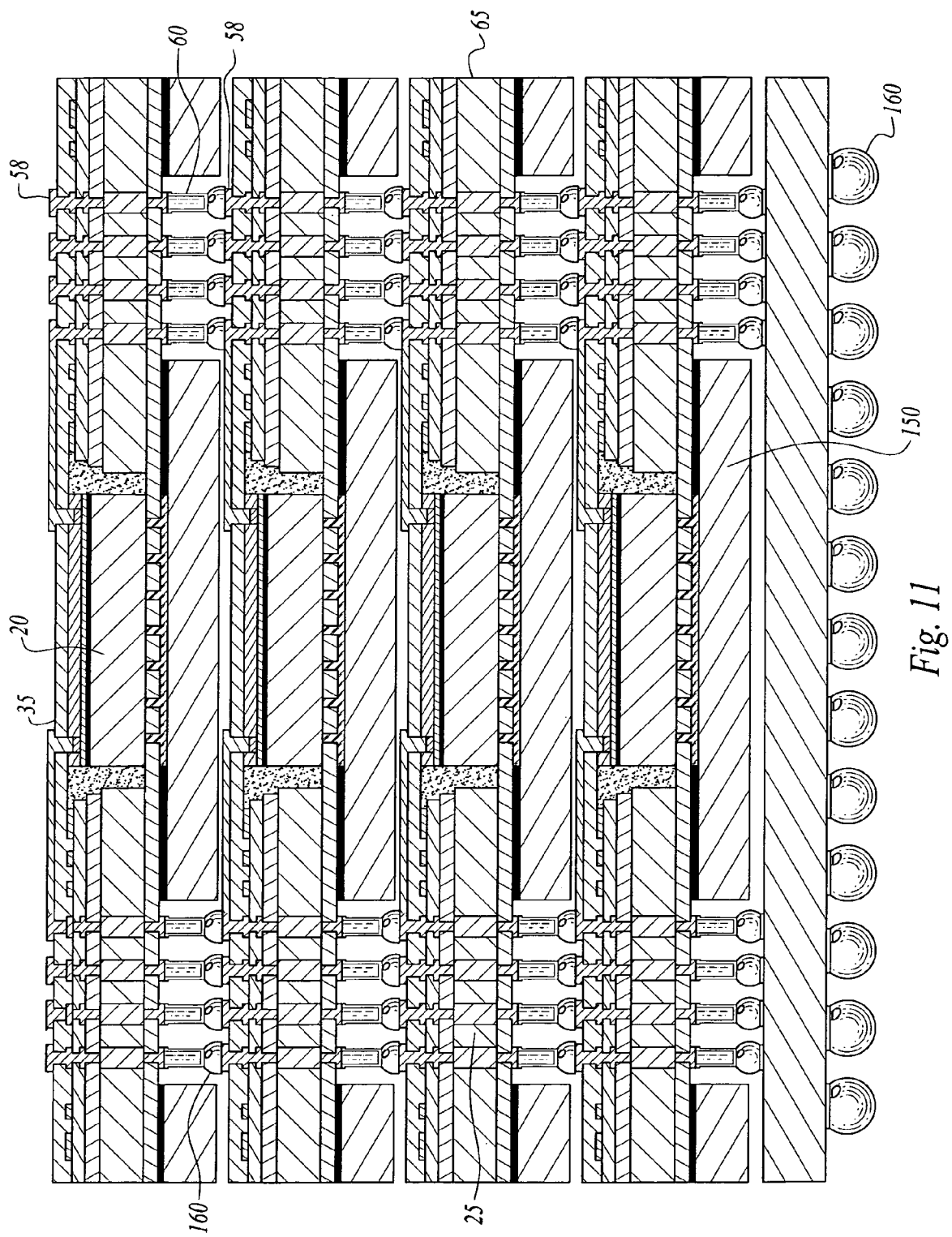
FIG. 11 is a cross-section of an exemplar module of FIG. 10N comprising a stack of interconnected tier structures.
Figure 12:
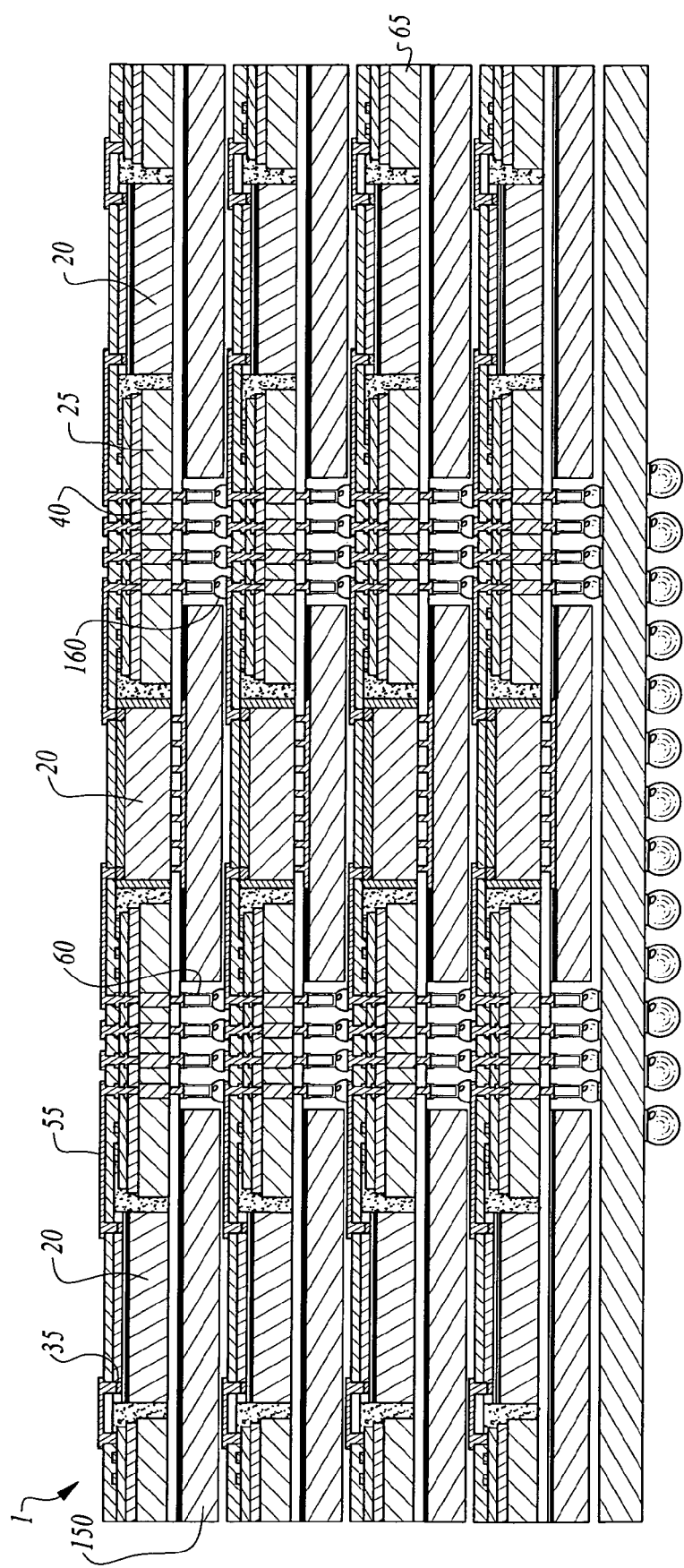
FIG. 12 illustrates a cross-section of an exemplar module comprising a stack of interconnected tier structures, each tier structures comprising an FPGA and two memory devices and having a ball grid array patterned formed on the lower surface thereof.

Alternative embodiments of the stacked tier module of the invention reflecting the interconnection using metallized polymer columns and the use of thermal management layers to improve system heat dissipation are shown in FIG. 11 and FIG. 12.

FIG. 11 reflects the four-tier module 65 of FIG. 10N with each layer having a thermal management layer in a ball grid array format.

FIG. 12 illustrates an alternative embodiment as a four-tier module 65 wherein each layer contains a thermal management layer 150 and three representative integrated circuit die 20, such as, by way of example, an FPGA and two memory devices capable of supporting FPGA functions.

As is seen above, the resultant tier structure and stacked tier module provide for a versatile, modular, high density electronic package capable of high circuit interconnect count and system I/O count, using established semiconductor packaging processes.

It must be understood that the illustrated embodiments have been set forth only for the purpose of example and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub-combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

We claim:

1. A tier structure comprising:
    a tier frame including a first tier side, a second tier side, a feedthrough structure, and an integrated circuit die comprising an I/O pad, wherein the feedthrough structure comprises a conductive structure including a photoresist, wherein the conductive structure is configured to route electrical signals through the tier frame, and wherein the I/O pad is electrically connected to the conductive structure by a conductive trace; and
    an exposed electrically-conductive pad disposed on the first or second tier side, wherein the exposed electrically-conductive pad is electrically connected to the conductive structure.

2. The tier structure of claim 1, wherein the tier frame further comprises a molded dielectric material.

3. The tier structure of claim 1, wherein the tier frame further comprises a polyimide material.

4. The tier structure of claim 1, wherein the conductive structure comprises a metallized polymer column.

5. The tier structure of claim 4, wherein the metallized polymer column comprises an anisotropic conductive film.

6. The tier structure of claim 4, wherein the metallized polymer column comprises an anisotropic conductive paste.

7. The tier structure of claim 1, wherein the tier frame further comprises silicon, and wherein the conductive structure comprises a conductive via defined in the tier frame.

8. The tier structure of claim 7, wherein the silicon has a resistivity greater than 100 ohms per centimeter.

9. The tier structure of claim 1, further comprising an aperture configured to receive the feedthrough structure.

10. The tier structure of claim 1, wherein the exposed electrically-conductive pad is electrically connected to the conductive structure by the conductive trace.

11. A tier structure comprising:
    a prefabricated tier frame including a first tier side, a second tier side, a prefabricated feedthrough structure, and a prefabricated integrated circuit die comprising an I/O pad, wherein the prefabricated feedthrough structure comprises a conductive structure including a photoresist, wherein the conductive structure is configured to route electrical signals through the tier frame, and wherein the I/O pad is electrically connected to the conductive structure by a conductive trace; and
    an exposed electrically-conductive pad disposed on the first or second tier side, wherein the exposed electrically-conductive pad is electrically connected to the conductive structure.

12. The tier structure of claim 11, wherein the prefabricated tier frame further comprises molded dielectric material.

13. The tier structure of claim 11, wherein the prefabricated tier frame further comprises a polyimide material.

14. The tier structure of claim 11, wherein the conductive structure comprises a prefabricated metallized polymer column.

15. The tier structure of claim 11, wherein the prefabricated tier frame further comprises silicon, and wherein the conductive structure comprises a conductive via defined in the prefabricated tier frame.

16. The tier structure of claim 11, wherein the exposed electrically-conductive pad is electrically connected to the conductive structure by the conductive trace.

17. A tier structure comprising:
    a tier frame including a first tier side, a second tier side, a feedthrough structure, and an integrated circuit die comprising an I/O pad, wherein the feedthrough structure comprises a conductive structure including a photoresist, wherein the conductive structure is configured to route electrical signals through the tier frame, and wherein the I/O pad is electrically connected to the conductive structure by a conductive trace; and
    an exposed electrically-conductive pad disposed on the first or second tier side, wherein the exposed electrically-conductive pad is electrically connected to the conductive structure by the conductive trace.

18. The tier structure of claim 17, wherein the tier frame further comprises a molded dielectric material.

19. The tier structure of claim 17, wherein the tier frame further comprises a polyimide material.

20. The tier structure of claim 17, wherein the conductive structure comprises a metallized polymer column.

21. The tier structure of claim 20, wherein the metallized polymer column comprises an anisotropic conductive film or an anisotropic conductive paste.

22. The tier structure of claim 17, wherein the tier frame further comprises silicon and wherein the conductive structure comprises a conductive via defined in the tier frame.

23. The tier structure of claim 17, further comprising an aperture configured to receive the feedthrough structure.

24. A stack comprising:
a first tier structure including a first tier frame that comprises a first tier side, a second tier side, a first feedthrough structure, and a first integrated circuit die that comprises a first I/O pad, wherein the first feedthrough structure comprises a first conductive structure configured to route electrical signals from the first or second tier side through the first tier frame, wherein the first conductive structure includes a photoresist, and wherein the first I/O pad is electrically connected to the first conductive structure by a first conductive trace;
a second tier structure including a second tier frame that comprises a third tier side, a fourth tier side, a second feedthrough structure, and a second integrated circuit die that comprises a second I/O pad, wherein the second feedthrough structure comprises a second conductive structure configured to route electrical signals from devices on the third or fourth tier side through the second tier frame, and wherein the second I/O pad is electrically connected to the second conductive structure by a second conductive trace;
a first exposed electrically-conductive pad electrically connected to the first conductive structure and disposed on the first or second tier side;
a second electrically-conductive pad electrically connected to the second conductive structure and disposed on the third or fourth tier side; and
a third conductive structure configured to electrically connect the first I/O pad to the second I/O pad.

25. The stack of claim 24, wherein the third conductive structure comprises an anisotropic conductive film.

26. The stack of claim 24, wherein the third conductive structure comprises an anisotropic conductive paste.

27. The stack of claim 24, wherein the third conductive structure comprises a metallized polymer column.

28. The stack of claim 24, wherein the third conductive structure comprises a stacked stud bump column including a plurality of stacked stud bumps.

29. The stack of claim 24, further comprising a thermal management layer between the first and second tier structures.

30. The stack of claim 24, further comprising a copper shim between the first and second tier structures.

\* \* \* \* \*

UNITED STATES PATENT AND TRADEMARK OFFICE
CERTIFICATE OF CORRECTION

| | | |
|---|---|---|
| PATENT NO. | : 7,919,844 B2 | |
| APPLICATION NO. | : 11/524090 | |
| DATED | : April 5, 2011 | |
| INVENTOR(S) | : Ozguz | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Second Day of August, 2011

David J. Kappos
*Director of the United States Patent and Trademark Office*

UNITED STATES PATENT AND TRADEMARK OFFICE
CERTIFICATE OF CORRECTION

Page 1 of 1

PATENT NO. : 7,919,844 B2
APPLICATION NO. : 11/524090
DATED : April 5, 2011
INVENTOR(S) : Ozguz et al.

It is certified that error appears in the above-identified patent and that said Letters Patent is hereby corrected as shown below:

Title page, item (57), under "Abstract", in Column 2, Line 6, delete "ore" and insert -- or --.

Signed and Sealed this
Eighteenth Day of October, 2011

David J. Kappos
*Director of the United States Patent and Trademark Office*